United States Patent [19]

Asada et al.

[11] 4,256,980
[45] Mar. 17, 1981

[54] ELECTRONIC SWITCHOVER CIRCUIT

[75] Inventors: Akihiro Asada; Hiromichi Tanaka, both of Yokohama; Kaname Ohta, Katsuta, all of Japan

[73] Assignee: Hitachi, Ltd., Japan

[21] Appl. No.: 964,117

[22] Filed: Nov. 28, 1978

[30] Foreign Application Priority Data

Nov. 30, 1977 [JP] Japan .................. 52-142727

[51] Int. Cl.³ .................. H03K 17/16; H03K 17/62
[52] U.S. Cl. .................. 307/254; 307/243; 328/163
[58] Field of Search .............. 307/243, 253, 254, 255, 307/262, 362; 328/163, 165

[56] References Cited

U.S. PATENT DOCUMENTS

| | | | |
|---|---|---|---|
| 3,783,307 | 1/1974 | Breuner | 307/243 |
| 3,877,023 | 4/1975 | Spicer et al. | 307/243 X |
| 4,037,118 | 7/1977 | Sieborger et al. | 307/255 |

Primary Examiner—John Zazworsky
Attorney, Agent, or Firm—Craig and Antonelli

[57] ABSTRACT

There is disclosed an electronic switchover circuit which can eliminate noises caused when two or more input signals are electronically selected to deliver out one of these input signals. A plurality of differential amplifier sets each having first and second transistors of which the first transistor receives the input signal are provided for the circuit, and a control voltage is applied to the control terminal of a constant current source to enable only one of the plurality of differential amplifier sets to thereby deliver out the input signal applied to the one differential amplifier set while disabling the remaining differential amplifier set. The base of the first transistor of the respective differential amplifier sets is connected with a third transistor which operates in the opposite phase relationship to the associated differential amplifier set, whereby base potentials of the first transistors of the differential amplifier sets which are disabled can be kept constant.

3 Claims, 5 Drawing Figures

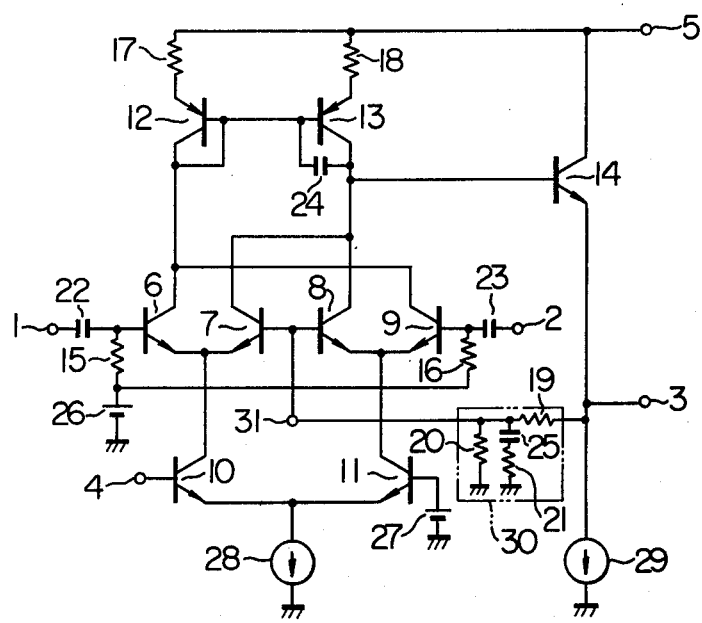
FIG. 1 PRIOR ART
PRIOR ART
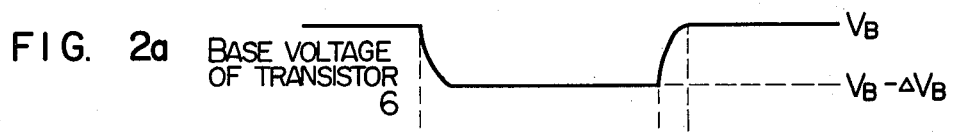
FIG. 2a BASE VOLTAGE OF TRANSISTOR 6
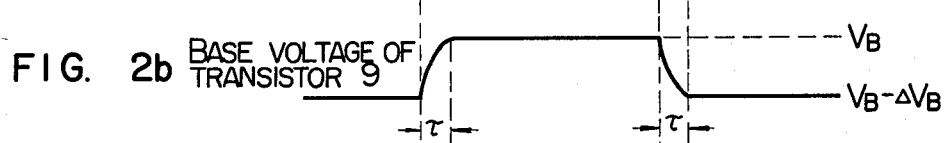
FIG. 2b BASE VOLTAGE OF TRANSISTOR 9
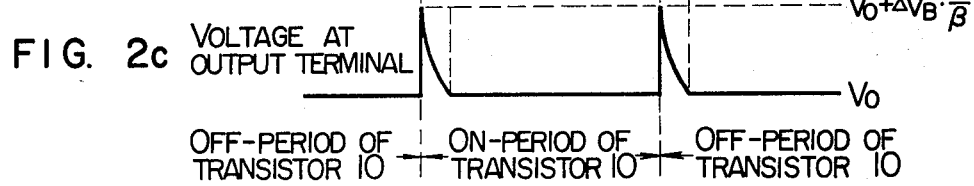
FIG. 2c VOLTAGE AT OUTPUT TERMINAL

ELECTRONIC SWITCHOVER CIRCUIT

BACKGROUND OF THE INVENTION

1. Field of the Invention

The present invention relates to an electronic switchover circuit which is used for applying only one input signal to a loudspeaker by electronically selecting in accordance with the selection of a user either one of at least two input signals, such as for example an original sound signal from the tuner in a tape recorder and a tape reproducing signal originating from recording of the original sound signal on a magnetic tape and subsequent reproduction of a recorded signal from the magnetic tape.

2. Description of the Prior Art

FIG. 1 shows a prior art electronic switchover circuit and FIGS. 2a, 2b and 2c show voltage wave forms appearing at the base of a transistor 6, the base of a transistor 9 and an output terminal 3, respectively of the circuit shown in FIG. 1.

In FIG. 1, first and second input terminals designated by reference numerals 1 and 2, in an exemplary application to the tape recorder as mentioned above, are constantly supplied with the original sound signal and the tape reproducing signal, respectively, and one of these signals is selectively delivered from the output terminal 3. A first differential amplifier comprises the transistor 6 with its base connected to a bias power source 26 via a resistor 15 and to the first input terminal 1 via a capacitor 22, and a transistor 7 having its base connected to a feedback terminal 31. A second differential amplifier comprises the transistor 9 with its base connected to the bias power source 26 via a resistor 16 and to the second input terminal 2 via a capacitor 23, and a transistor 8 having its base connected to the feedback terminal 31.

A transistor 10 having its base connected to a control terminal 4, a transistor 11 having its base connected to a bias power source 27 and a constant current source 28 connected in common to the emitters of the transistors 10 and 11 are adapted to constitute a third differential amplifier. The third differential amplifier, whose output terminal consists of the collectors of the transistors 10 and 11 respectively connected to the first and second differential amplifiers, serves as a constant current source for these first and second differential amplifiers.

To describe connections of the collectors of the transistors 6, 7, 8 and 9 constituting the first and second differential amplifiers, the collectors of the transistors 6 and 9 on the one hand are connected to each other and to the collector of a transistor 12 and the collectors of the transistors 7 and 8 on the other hand are also connected to each other and to the collector of a transistor 13. The transistor 12 is of an opposite conduction type to the transistor 6 and has its base and collector connected in common and its emitter connected to a power supply terminal 5 via a resistor 17. The transistor 13 being of the same conduction type as the transistor 12 has its base connected to the collector of the transistor 12 and to its collector via a capacitor 24 and its emitter connected to the power supply terminal 5 via a resistor 18. The collector of the transistor 13 is also connected to the output terminal 3 via an emitter follower connection which is constituted by a transistor 14 and a constant current source 29. This output terminal 3 is also connected to the feedback terminal 31 via a feedback circuit generally designated by reference numeral 30 which includes resistors 19, 20 and 21 and a capacitor 25.

The operation of this electronic switchover circuit will now be described. Essentially, this circuit operates such that when a control signal associated with an operation button (not shown) which is operated by the user who desires to select one of the two input signals is applied to the control terminal 4, the collector currents of the transistors 10 and 11 constituting the third differential amplifier, that is, the values of constant currents supplied to the first and second differential amplifiers, are changed to cause a complementary change in the gains of the first and second differential amplifiers so that only one of the two input signals applied to the input terminals 1 and 2 can be delivered out from the output terminal 3.

For example, if the control terminal 4 receives a control voltage which is sufficiently larger than the voltage of the bias power source 27, the constant current flows through only the transistor 10 in accordance with the well-known characteristic of the differential amplifier and the collector current of the transistor 11 falls to zero. Consequently, in relation to the input signal applied to the input terminal 2 of the second differential amplifier comprised of the transistors 8 and 9 and the feedback signal applied to the feedback terminal 31, the collector currents of the transistors 8 and 9 are interrupted, resulting in zero gain. In other words, the second differential amplifier comprised of the transistors 8 and 9 stops its function.

On the other hand, the first differential amplifier comprised of the transistors 6 and 7 retains its well-known differential amplifier operation by passing the constant current identified as the amount of current of the constant current source 28. At this time, the first differential amplifier being loaded with the resistor 17, transistor 12, resistor 18 and transistor 13, the emitter follower connection comprised of the transistor 14 and constant current source 29 and the feedback circuit 30 establish a well-known differential type negative feedback amplifier. Accordingly, only the input signal applied to the input terminal 1 is amplified at a gain determined by the feedback circuit 30 and delivered out from the output terminal 3.

If the control terminal 4 receives a control voltage which is sufficiently smaller than the voltage of the bias power source 27, the first differential amplifier stops its function in contrast to the foregoing operation and the second differential amplifier is activated to thereby allow only the other input signal applied to the input terminal 2 to be delivered from the output terminal 3.

Unfortunately, with this circuit, the output voltage at the output terminal 3 is accompanied by transient period voltage variations, as shown in FIG. 2c, in the course of the transient states resulting from the switchover for the selective delivery of the output by means of the control voltage at the control terminal 4. Reasons for the generation of these variations will be described in the following paragraphs.

When the control voltage received by the control terminal 4 is sufficiently smaller than the voltage of the bias power source 27, that is to say, when the input signal at the input terminal 2 is selected to be delivered from the output terminal 3 with the transistor 10 rendered off, there occurs no current flow through the transistors 6 and 7 so that the base voltage of the transistor 6 equals a voltage $V_B$ of the bias power source 26, as shown at the lefthand portion in FIG. 2a. On the other hand, since a current equal to half the amount of the current $I_o$ of the current source 28 is flowing through each of the transistors 8 and 9, a current equal to $1/h_{FE}$ of the collector current of the transistor 9, which is identified as the base current, passes through the resistor 16 where $h_{FE}$ represents a direct current amplification factor of the transistor 9. Where this base current generates a potential difference of $\Delta V_B$ across the resistor 16, the base voltage of the transistor 9 equals $V_B - \Delta V_B$ as shown at the lefthand portion in FIG. 2b.

Subsequently, when the control voltage at the control terminal 4 changes to be sufficiently larger than the voltage of the bias power source 27, the transistor 10 is turned on to thereby allow the input signal at the input terminal 1 to be delivered out from the output terminal 3. At this time, the relation between the base voltages of the transistors 6 and 9 is reversed owing to the symmetry of the circuit, that is to say, the base voltage of the transistor 6 decreases to $V_B - \Delta V_B$ as shown at the middle portion in FIG. 2a, and the base voltage of the transistor 9 increases to $V_B$ as shown at the middle portion in FIG. 2b.

At the time that the transistors 10 and 11 undergo the off to on or on to off change in this manner, the base voltages of the transistors 6 and 9 are respectively subjected to transient changes which are managed by a time constant $\tau$ determined by the capacitor 22 and resistor 15 and the capacitor 23 and resistor 16.

In connection with the output voltage at the output terminal 3, with the transistor 10 rendered off the second differential amplifier comprised of the transistors 8 and 9 is activated so that the voltage at the output terminal 3 follows the base voltage of the transistor 9; whereas, with the transistor 10 rendered on, the first differential amplifier comprised of the transistors 6 and 7 is activated so that the voltage at the output terminal 3 follows the base voltage of the transistor 6. At the time that the transistor 10 changes from the off-state to the on-state, the voltage to be followed by the output terminal 3 rapidly changes from the base voltage $V_B - \Delta V_B$ of the transistor 9 to the base voltage $V_B$ which the transistor 6 assumes immediately after the off to on change of the transistor 10. Thereafter, the base voltage of the transistor 6 undergoes a transient change in accordance with the time constant $\tau$ determined by the capacitor 22 and resistor 15 until it reaches $V_B - \Delta V_B$.

When the voltage at the output terminal 3 has a value of $V_o$ when the base voltage of transistors 6 or 9 is $V_B - \Delta V_B$ and the feedback circuit 30 has a feedback which is a fraction of $\beta$, the voltage at the output terminal 3 immediately after the off to on change of the transistor 10 is raised to $V_o + \Delta V_B \cdot 1/\beta$ and is then decreased in accordance with the aforementioned time constant, reaching the stationary state at the level of $V_o$. With the on to off change of the transistor 10, the voltage at the output terminal 3 undergoes a similar transient change. FIG. 2c shows these transient changes. For simplicity of description, it is assumed that the transistors 6, 7, 8 and 9 have the same characteristic, capacitors 22 and 23 have the same capacitance and resistors 15 and 16 have the same resistance.

In this manner, the prior art electronic switchover circuit is defective in that voltage variations at the output terminal occur, resulting in noises (pop noises) which are harsh to the ears.

SUMMARY OF THE INVENTION

The present invention is achieved on the aforementioned background and has for its object to provide an electronic switchover circuit capable of eliminating the undesirable voltage variations at the output terminal.

According to the invention, the bases of the transistors 6 and 9 which are rendered on or off by the control voltage are connected with transistors which operate in opposite phase relationship to the transistors 6 and 9 to ensure that the base potentials of the transistors 6 and 9 are kept constant irrespective of the turning-on or turning-off of the transistors 6 and 9, whereby the undesirable voltage variations at the output terminal can be eliminated.

BRIEF DESCRIPTION OF THE DRAWINGS

FIG. 1 is a circuit diagram of one example of a prior art electronic switchover circuit.

FIGS. 2a, 2b and 2c are wave-form diagrams showing voltage variations in the circuit of FIG. 1.

DETAILED DESCRIPTION OF THE PREFERRED EMBODIMENT

Figure 3:
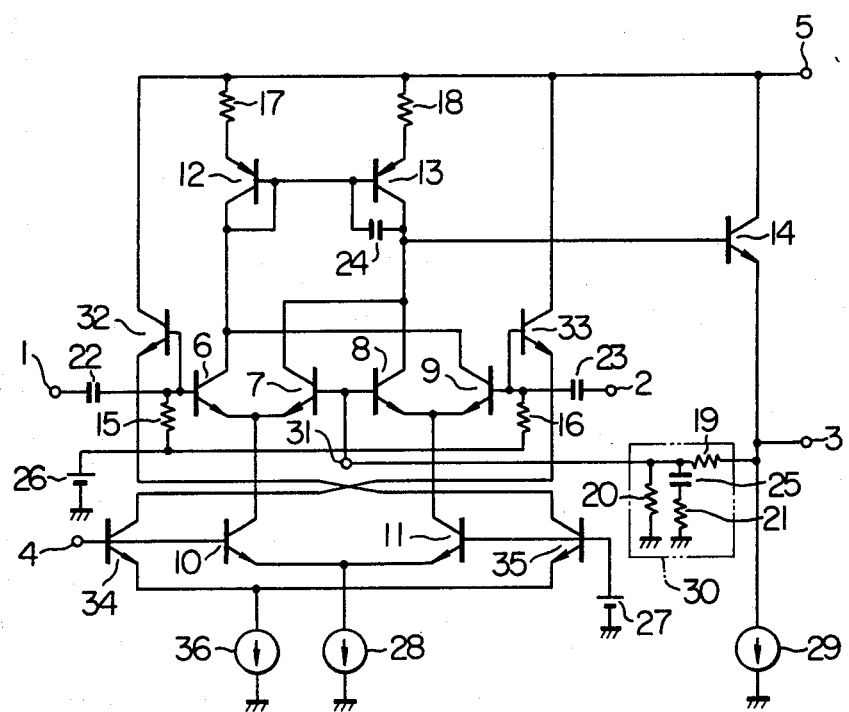
FIG. 3 is a circuit diagram of an electronic switchover circuit embodying the invention.

FIG. 3 shows one embodiment of the invention, in which elements having the same function as those in FIG. 1 are designated by the same reference numerals. An electronic switchover circuit according to this embodiment comprises, in comparison with the prior art circuit of FIG. 1, an additional fourth differential amplifier including a transistor 32 having its collector connected to the power supply terminal 5 and its base connected to the base of the transistor 6, a transistor 33 having its collector also connected to the power supply terminal 5 and its base connected to the base of the transistor 9, a transistor 34 having its base connected to the control terminal 4 and its collector connected to the emitter of the transistor 33, a transistor 35 having its base connected to the bias power source 27 and its collector connected to the emitter of the transistor 32, and a constant current source 36 connected in common to the emitters of the transistors 34 and 35. The constant current source 36 is designed to pass a current which is half the current that the constant current source 28 passes.

The signal selecting function of this circuit is the same as that of the foregoing prior art circuit and is not described herein. In this embodiment, when the control terminal 4 receives a control voltage which is sufficiently larger than the voltage of the bias power source 27, in other words, when the input signal applied to the input terminal 1 is selected to be delivered from the output terminal 3, it follows that the collector current of the transistor 10 equals $I_o$ of the current of constant current source 28 and the collector current of the transistor 34 equals $I_o/2$ of the current of constant current source 36. At this time, the collector current of the transistors 6 and 7 equals $I_o/2$ and the transistor 33 passes a collector current of $I_o/2$ which is equal to the collector current of the transistor 34. The collector current of the transistors 11 and 35 is zero, causing the transistors 8, 9 and 32 to pass no collector current.

Consequently, the resistor 15 passes therethrough the base current of the transistor 6 whereas the resistor 16 passes therethrough the base current of the transistor 33. Since, as described above, the transistors 6 and 33 pass the same amount of collector current which is $I_o/2$, resistors 15 and 16 pass therethrough the same amount of current which is $I_o/2h_{FE}$ so far as direct current amplification factors $h_{FE}$ of the transistors 6 and 33 are equal to each other.

Conversely, when the control terminal 4 receives a control voltage which is sufficiently smaller than the voltage of the bias power source 27, that is to say, when the input signal applied to the input terminal 2 is selected to be delivered from the output terminal 3, the collector current of the transistors 8, 9, 32 and 35 which has been zero changes now to $I_o/2$ owing to symmetry of the circuit and hence 11 passes a collector current of $I_o$. Consequently, the base current of the transistor 32 passes through the resistor 15 whereas the base current of the transistor 9 passes through the resistor 16, which is $I_o/2h_{FE}$ so far as direct current amplification factors of the transistors 32 and 9 are equal those of the transistors 6 and 33. In this manner, the resistors 15 and 16 pass the same amount of current irrespective of the control voltage at the control terminal 4 so that the base voltages of the transistors 6 and 9 are always equal to each other provided that the resistances of the resistors 15 and 16 are equal to each other.

As will be seen from the foregoing description, according to the invention, it is possible to eliminate undesirable variations in the voltage at the output terminal 3 during the selective switchover of the two input signals. The foregoing description has been given on the assumption that direct current amplification factors $h_{FE}$ of the transistors 6, 9, 32 and 33 are equal to each other, but a difference in $h_{FE}$ obviously gives rise to output voltage variations. However, as far as two transistors formed in one chip of a monolithic IC are concerned, a ratio between their direct current amplification factors can fall within about 10%. In addition, it is possible to set a ratio between resistances of the resistors associated with these transistors to within about ±2%. Therefore, in comparison with the prior art circuit not provided with any compensating circuit, the electronic switchover circuit according to the invention can suppress the output voltage variation to about 1/10 or less and can correctly deliver the input voltages from the output terminal.

The invention thus suppressing the output voltage variation upon the selective switchover of the two input signals to 1/10 or less in comparison with the prior art can provide an electronic switchover circuit having excellent switchover characteristics.

We claim:
1. In an electronic switchover circuit comprising,
at least two differential amplifier sets each having an independent input signal terminal and first and second transistors connected differentially; and
control means for selectively operating one of the differential amplifier sets, said control means including a controlling differential amplifier having third and fourth transistors in differential connection respectively connected in series with each differential amplifier set and a constant current source, wherein the differential amplifier sets are selectively on-off controlled by selectively on-off controlling the third and fourth transistors of the controlling differential amplifier to thereby deliver out the input signal applied to the selected differential amplifier set;
the improvement which comprises a pair of fifth transistors connected respectively to the bases of the first transistors on the input signal side of the two differential amplifier sets, said fifth transistors being connected so as to be non-conductive when the associated first transistor is conductive but being conductive when the associated first transistor is not conductive.

2. In an electronic switchover circuit comprising,
at least two differential amplifier sets each having an independent input signal terminal and first and second transistors connected differentially; and
a first constant current source and control means for selectively operating one of the differential amplifier sets by supplying a constant current from said constant current source to the selected differential amplifier set, wherein input signals applied to the differential amplifier sets are selectively delivered out;
the improvement which comprises a pair of third transistors connected respectively to the bases of the first transistors on the input signal side of the two differential amplifier sets, means for individually rendering said third transistors non-conductive when the associated first transistor is conductive and for individually rendering said third transistors conductive when the associated first transistor is not conductive, and means including a second constant current source for supplying a constant current to said pair of third transistors.

3. An electronic switchover circuit comprising;
(1) at least two differential amplifier sets each having a first transistor with its base connected to receive a respective one of first and second input signals and a second transistor connected differentially with the first transistor;
(2) a first constant current source including first control means for selectively operating one of the differential amplifier sets by supplying a constant current to the selected differential amplifier set;
(3) a subsequent stage amplifier for receiving and amplifying the output of the differential amplifier sets and being connected to produce an output which is returned to the base of the second transistors of the two differential amplifier sets;
(4) a pair of third transistors each having a base connected to the base of a respective first transistor of the two differential amplifier sets;
(5) second control means for operating the third transistors in opposite phase relation with the two amplifier sets associated with said first transistors; and
(6) a second constant current source for supplying the third transistors with the same amount of constant current as that for the first transistors.

* * * * *